(12) United States Patent
Wang et al.

(10) Patent No.: US 10,622,483 B2
(45) Date of Patent: Apr. 14, 2020

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Meili Wang, Beijing (CN); Liangchen Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,645

(22) PCT Filed: May 19, 2016

(86) PCT No.: PCT/CN2016/082609
§ 371 (c)(1),
(2) Date: May 25, 2017

(87) PCT Pub. No.: WO2017/173712
PCT Pub. Date: Oct. 12, 2017

(65) Prior Publication Data
US 2018/0190831 A1 Jul. 5, 2018

(30) Foreign Application Priority Data

Apr. 5, 2016 (CN) .......................... 2016 1 0206441

(51) Int. Cl.
*H01L 27/14* (2006.01)
*H01L 29/786* (2006.01)
(Continued)

(52) U.S. Cl.
CPC .. *H01L 29/78675* (2013.01); *H01L 21/32136* (2013.01); *H01L 27/1222* (2013.01);
(Continued)

(58) Field of Classification Search
CPC ............. H01L 29/786; H01L 29/78675; H01L 29/66757; H01L 29/4908; H01L 27/1222; H01L 27/1262
See application file for complete search history.

(56) References Cited

U.S. PATENT DOCUMENTS 5,580,800 A * 12/1996 Zhang ............... H01L 21/02071
148/DIG. 51
5,801,398 A * 9/1998 Hebiguchi ............ H01L 29/458
257/66
(Continued)

FOREIGN PATENT DOCUMENTS

CN 1554974 A 12/2004
JP 2005259780 A 9/2005

OTHER PUBLICATIONS

International Search Report for Chinese International Application No. PCT/CN2016/082609 dated Dec. 30, 2016.
(Continued)

*Primary Examiner* — Phuc T Dang
(74) *Attorney, Agent, or Firm* — Calfee, Halter & Griswold LLP

(57) ABSTRACT

The present disclosure provides a Thin Film Transistor and a method for manufacturing the same, an array substrate and a display device, so as to increase on-state currents of the Thin Film Transistor and improve current characteristics of the Thin Film Transistor. The Thin Film Transistor includes a base substrate, a gate insulating layer and a gate disposed above the base substrate; wherein a conductive layer is also disposed between the gate insulating layer and the gate; wherein the projection of the conductive layer on the base substrate is larger than the projection of the gate on the base substrate.

12 Claims, 7 Drawing Sheets

(51) Int. Cl.
    *H01L 29/423*     (2006.01)
    *H01L 21/3213*     (2006.01)
    *H01L 27/12*     (2006.01)
    *H01L 29/49*     (2006.01)
    *H01L 29/66*     (2006.01)

(52) U.S. Cl.
    CPC .... *H01L 27/1262* (2013.01); *H01L 29/42384* (2013.01); *H01L 29/4908* (2013.01); *H01L 29/66757* (2013.01); *H01L 29/78618* (2013.01); *H01L 27/1248* (2013.01)

(56) References Cited

U.S. PATENT DOCUMENTS

| | | | |
|---|---|---|---|
| 7,880,241 B2 * | 2/2011 | Arnold | H01L 21/2807 257/192 |
| 2002/0063287 A1 | 5/2002 | Yamazaki et al. | |
| 2007/0241336 A1 | 10/2007 | Tokioka et al. | |
| 2016/0233253 A1 * | 8/2016 | Kim | H01L 27/1248 |
| 2017/0243943 A1 * | 8/2017 | Won | H01L 29/408 |

OTHER PUBLICATIONS

First Office Action for Chinese Patent Application No. 201610206441.6 dated Mar. 2, 2018.

* cited by examiner

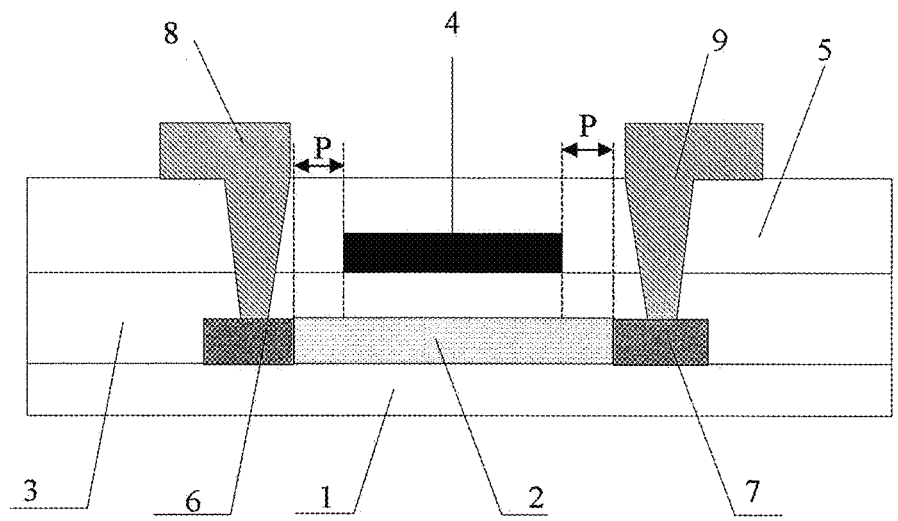
Fig. 1- Prior Art
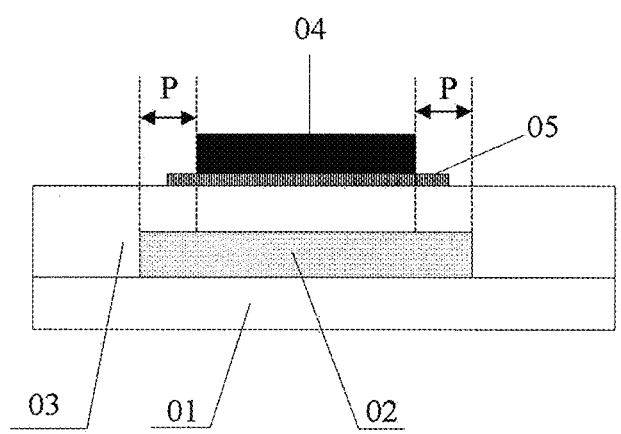
Fig.2

# THIN FILM TRANSISTOR, ARRAY SUBSTRATE AND DISPLAY DEVICE

RELATED APPLICATIONS

The present application is the U.S. national phase entry of PCT/CN2016/082609 with an International filing date of May 19, 2016, which claims the benefit of Chinese Application No. 201610206441.6, filed on Apr. 5, 2016, the entire disclosures of which are incorporated herein by reference.

TECHNICAL FIELD

The present disclosure relates to the field of display technology, and more particularly to a Thin Film Transistor (TFT) and a method for manufacturing the same, an array substrate and a display device.

BACKGROUND ART

In comparison with amorphous silicon (a-Si) Thin Film Transistors, polysilicon, especially low-temperature polysilicon, Thin Film Transistors have higher electron mobility, better liquid crystal characteristics and less leakage current, and have gradually replaced a-Si Thin Film Transistors to become a mainstream of Thin Film Transistors.

SUMMARY

The present disclosure provides a Thin Film Transistor and a method for manufacturing the same, an array substrate and a display device, so as to increase on-state currents of the Thin Film Transistor and improve current characteristics of the Thin Film Transistor.

An embodiment of the present disclosure provides a Thin Film Transistor, comprising a base substrate, a gate insulating layer and a gate disposed above the base substrate; wherein a conductive layer is also disposed between the gate insulating layer and the gate; wherein the projection of the conductive layer on the base substrate is larger than the projection of the gate on the base substrate.

In a possible embodiment, the Thin Film Transistor provided by the embodiment of the present disclosure further comprises an active layer disposed between the base substrate and the gate insulating layer.

In a possible embodiment, in the Thin Film Transistor provided by the embodiment of the present disclosure, the projection of the conductive layer on the base substrate and the projection of the active layer on the base substrate at least partially overlap.

In a possible embodiment, in the Thin Film Transistor provided by the embodiment of the present disclosure, the conductive layer is made of one or more materials of a carbon material, metallic material and metallic oxide which are conductive.

In a possible embodiment, the Thin Film Transistor provided by the embodiment of the present disclosure further comprises a source area electrically connected with a source to be formed and a drain area electrically connected with a drain to be formed, which are located on the same layer as the active layer and are oppositely arranged to each other.

In a possible embodiment, the Thin Film Transistor provided by the embodiment of the present disclosure further comprises the source and the drain located above the gate.

In a possible embodiment, the Thin Film Transistor provided by the embodiment of the present disclosure further comprises an interlayer dielectric layer located between the source and the gate, as well as between the drain and the gate;

wherein the source is electrically connected with the source area through a first through-hole passing through the interlayer dielectric layer and the gate insulating layer, and the drain is electrically connected with the drain area through a second through-hole passing through the interlayer dielectric layer and the gate insulating layer.

Correspondingly, an embodiment of the present disclosure also provides an array substrate, comprising any Thin Film Transistor provided by the embodiments of the present disclosure.

In a possible embodiment, the array substrate provided by the embodiment of the present disclosure further comprises a flat layer and a pixel electrode ordinally located above the Thin Film Transistor; wherein the pixel electrode is electrically connected with the drain in the Thin Film Transistor through a contact hole.

Correspondingly, an embodiment of the present disclosure further provides a display device comprising any array substrate provided by the embodiments of the present disclosure.

Correspondingly, an embodiment of the present disclosure further provides a method for manufacturing a Thin Film Transistor, comprising the steps of:

forming a pattern of a gate insulating layer on a base substrate;

forming a conductive layer on the gate insulating layer;

forming a pattern of a gate on the conductive layer;

processing the conductive layer by a patterning process and forming a pattern of the conductive layer, so that the projection of the pattern of the conductive layer on the base substrate is greater than the projection of the gate on the base substrate.

In a possible embodiment, in the method for manufacturing a Thin Film Transistor provided by the embodiment of the present disclosure, before the step of forming a pattern of a gate insulating layer, the method further comprises the step of: forming a pattern of an active layer on the base substrate.

In a possible embodiment, in the method for manufacturing a Thin Film Transistor provided by the embodiment of the present disclosure, the projection of the pattern of the conductive layer on the base substrate and the projection of the active layer on the base substrate at least partially overlap.

In a possible embodiment, in the method for manufacturing a Thin Film Transistor provided by the embodiment of the present disclosure, the step of processing the conductive layer by a patterning process and forming a pattern of the conductive layer comprises the step of:

plasma bombarding the conductive layer by a plasma process so that the projection of the pattern of the conductive layer on the base substrate is greater than the projection of the active layer on the base substrate.

In a possible embodiment, the method for manufacturing a Thin Film Transistor provided by the embodiment of the present disclosure comprises the step of, when forming an active layer, a source area electrically connected with a source to be formed and a drain area electrically connected with a drain to be formed are formed simultaneously, which are located on the same layer as the active layer and are oppositely arranged to each other.

In a possible embodiment, the method for manufacturing a Thin Film Transistor provided by the embodiment of the present disclosure further comprises the step of forming a pattern of the source and that of the drain after the step of forming a pattern of the gate.

In a possible embodiment, after the step of forming a pattern of the gate and before the step of forming a pattern of the source and that of the drain, the method for manufacturing a Thin Film Transistor provided by the embodiment of the present disclosure comprises the steps of:

forming an interlayer dielectric layer covering the gate;

forming a first through-hole and a second through-hole passing through the interlayer dielectric layer and the gate insulating layer, the first through-hole used for electrically connecting the source to be formed with the source area, and the second through-hole for electrically connecting the drain to be formed with the drain area.

In a possible embodiment, in the method for manufacturing a Thin Film Transistor provided by the embodiment of the present disclosure, the conductive layer is made of one or more materials of a carbon material, metallic material and metallic oxide which are conductive.

In the Thin Film Transistor and the method for manufacturing the same, the array substrate and the display panel provided by the embodiments of the present disclosure, the Thin Film Transistor comprises a base substrate, and a gate insulating layer formed above the base substrate, a gate formed above the gate insulating layer, and a conductive layer disposed between the gate insulating layer and the gate, wherein the projection of the conductive layer on the base substrate is larger than the projection of the gate on the base substrate. In comparison with the prior art, in the Thin Film Transistor provided by an embodiment of the present disclosure, the conductive layer is disposed between the gate insulating layer and the gate, and the projection of the conductive layer on the base substrate is greater than the projection of the gate on the base substrate. Thus, the projection of the conductive layer on the base substrate covers the projection of the gate on the base substrate, i.e., the width of the cross-section of the conductive layer is greater than the width of the cross-section of the gate, such that there is the conductive layer electrically connected with the gate in the offset area between the gate and the active layer of the Thin Film Transistor. When there is voltage applied at the gate, the voltage in the offset area can be increased due to the conductive layer, thereby reducing the resistance experienced by carriers, and increasing on-state currents of the Thin Film Transistor and improving current characteristics of the Thin Film Transistor.

BRIEF DESCRIPTION OF DRAWINGS

FIG. 1 is a structural schematic view of a Thin Film Transistor in the prior art;

FIG. 2 is a structural schematic view of a Thin Film Transistor provided by an embodiment of the present disclosure;

DETAILED DESCRIPTION

Figure 3:
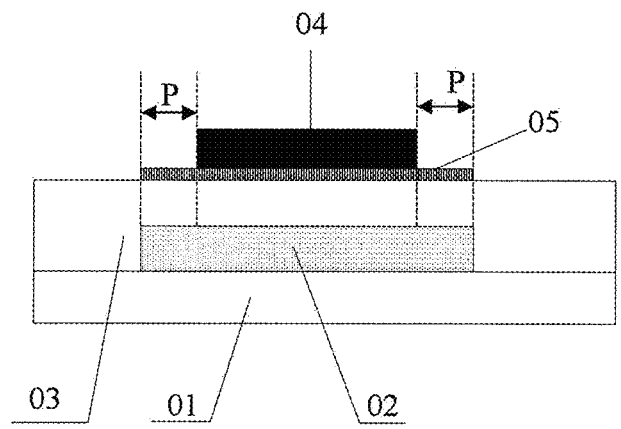
FIG. 3 is a structural schematic view of a further Thin Film Transistor provided by an embodiment of the present disclosure.

To clarify the object, technical solutions and advantages of the present disclosure, the present disclosure will be further described in detail with reference to the drawings. Apparently, the described embodiments are merely a part, not the whole, of the embodiments of the present disclosure. Based on the embodiments of the present disclosure, all other embodiments obtained by those ordinarily skilled in the art without making inventive effort fall within the protection scope of the present disclosure.

The specific implementations of the Thin Film Transistor and method for manufacturing the same, the array substrate and the display device provided by the embodiments of the present disclosure will be explained in detail with reference to the drawings.

It shall be explained that the thickness and shape of each membranous layer in the drawings do not show the real dimension of the Thin Film Transistor, but are only intended to schematically illustrate the present disclosure.

At present, the structure of a current polysilicon Thin Film Transistor, as shown in FIG. 1, comprises a base substrate 1, an active layer 2 located on the base substrate 1, a gate insulating layer 3 located on the active layer 2, the gate 4 on the gate insulating layer 3, a dielectric layer 5 located on the gate 4, a source area 6 electrically connected with the source and a drain area 7 electrically connected with the drain, which are located on the same layer as the active layer and are oppositely arranged to each other, and a source 8 and a drain 9 which are located on the dielectric layer 5; and the source 8 and the drain 9 are electrically connected with the source area 6 and the drain area 7 respectively through a through-hole passing through the dielectric layer 5 and the gate insulating layer 3.

In the polysilicon Thin Film Transistor, since there is an offset area P in the channel between the gate 4 and the active layer 2 of the Thin Film Transistor, the channel in the offset area cannot receive the voltage effect of the gate, thereby increasing the resistance experienced by carriers transferring and reducing on-state currents of the Thin Film Transistor.

Thus, how to improve the on-state currents of the polysilicon Thin Film Transistor is the technical problem to be solved by those skilled in the art.

With reference to FIG. 2, a Thin Film Transistor provided by an embodiment of the present disclosure comprises:

a base substrate 01, a gate insulating layer 03 and a gate 04 disposed above the base substrate 01;

wherein a conductive layer 05 is also disposed between the gate insulating layer 03 and the gate 04; wherein the projection of the conductive layer 05 on the base substrate is larger than the projection of the gate 04 on the base substrate.

In a specific embodiment, the Thin Film Transistor provided by the embodiment of the present disclosure, as shown in FIG. 2, further comprises an active layer 02 disposed between the base substrate 01 and the gate insulating layer 03.

In the Thin Film Transistor provided by an embodiment of the present disclosure, the conductive layer is disposed between the gate insulating layer and the gate, and the projection of the conductive layer on the base substrate is greater than the projection of the gate on the base substrate. Thus, the projection of the conductive layer on the base substrate covers the projection of the gate on the base substrate, i.e., the width of the cross-section of the conductive layer is greater than the width of the cross-section of the gate, such that there is the conductive layer electrically connected with the gate in the offset area P between the gate and the active layer. When there is voltage applied at the gate, the voltage in the offset area can be increased due to the conductive layer, thereby reducing the resistance experienced by carriers, and increasing on-state currents of the Thin Film Transistor and improving current characteristics of the Thin Film Transistor.

In the present disclosure, the Thin Film Transistor provided by an embodiment of the present disclosure will be explained by taking a top-gate structure as an example. However, as comprehended by those skilled in the art, the Thin Film Transistor provided by the embodiment of the present disclosure may also be of a bottom-gate structure, which will not be limited herein.

The Thin Film Transistor provided by an embodiment of the present disclosure is usually of a top-gate structure, i.e., the gate is located above the active layer. This is because the active layer is made of a polysilicon which is usually made at a high temperature, and the high temperature will affect the membranous layer thereunder. Hence, in the Thin Film Transistor provided by the embodiment of the present disclosure, with reference to FIG. 2, the gate 04 is located above the active layer 02.

In a specific embodiment, in the Thin Film Transistor provided by the embodiment of the present disclosure, with reference to FIG. 2, the projection of the conductive layer 05 on the base substrate 01 and the projection of the active layer 02 on the base substrate 01 partially overlap. Alternatively, with reference to FIG. 3, the projection of the conductive layer 05 on the base substrate 01 and the projection of the active layer 02 on the base substrate 01 overlap. In this case, the arranged conductive layer covers an offset area P between the active layer and the gate. When there is voltage applied at the gate, the voltage of the gate is applied to the entire active layer including the offset area by means of the conductive layer, thereby reducing the resistance experienced by carriers, and increasing on-state currents of the Thin Film Transistor and further improving current characteristics of the Thin Film Transistor.

In a specific embodiment, in the Thin Film Transistor provided by the embodiment of the present disclosure, the conductive layer 05 is made of one or more materials selected from the group consisting of a carbon material, metallic material and metallic oxide which are conductive. To be specific, the conductive layer may be made of a carbon material or a metallic material. The metallic oxide may comprise one or more oxides selected from the group consisting of In oxides, Zn oxides, Ga oxides and Sn oxides, which will not be limited herein.

Figure 4:
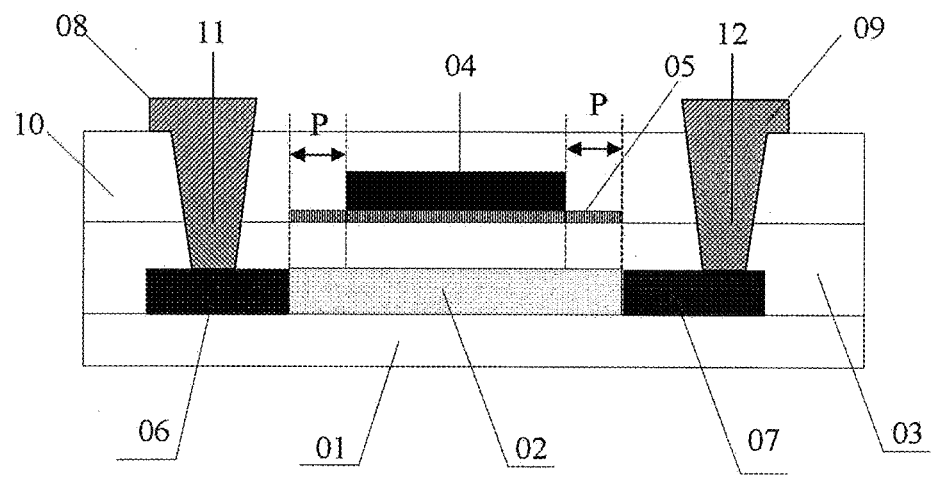
FIG. 4 is a structural schematic view of a yet Thin Film Transistor provided by an embodiment of the present disclosure.

In a specific embodiment, with reference to FIG. 4, the Thin Film Transistor provided by the embodiment of the present disclosure further comprises: a source area 06 electrically connected with a source to be formed and a drain area 07 electrically connected with a drain to be formed, which are located on the same layer as the active layer 02 and are oppositely arranged to each other.

The source area and the drain area can be formed with the active layer simultaneously or after the formation of the active layer, which will not be limited herein.

In a specific embodiment, with reference to FIG. 4, the Thin Film Transistor provided by the embodiment of the present disclosure further comprises: a source 08 and a drain 09 located above the gate 04. In a specific implementation, when the Thin Film Transistor is applied to a display panel, the drain of the Thin Film Transistor is usually required to be electrically connected with a pixel electrode located thereabove. Thus, as shown in FIG. 4, the source 08 and the drain 09 are both located above the gate 04.

Furthermore, when the Thin Film Transistor provided by the embodiment of the present disclosure is of a top-gate structure, the source and the drain may be located above the gate. Or they may be located under the gate as long as it can ensure that the gate is insulated from the source and the drain, which will not be limited herein.

In a specific embodiment, with reference to FIG. 4, the Thin Film Transistor provided by the embodiment of the present disclosure further comprises: an interlayer dielectric layer 10 located between the source 08 and the gate 04, as well as between the drain 09 and the gate 04, wherein the source 08 is electrically connected with the source area 06 through a first through-hole 11 passing through the interlayer dielectric layer 10 and the gate insulating layer 03, and the drain 09 is electrically connected with the drain area 07 through a second through-hole 12 passing through the interlayer dielectric layer 10 and the gate insulating layer 03.

Figure 5:
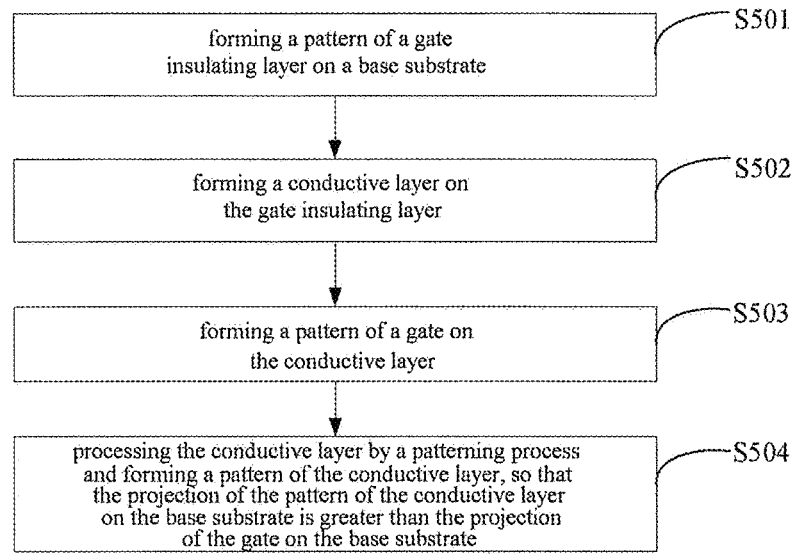
FIG. 5 is a flow chart of a method for manufacturing a Thin Film Transistor provided by an embodiment of the present disclosure.

Based on the same disclosed concept, an embodiment of the present disclosure further provides a method for manufacturing a Thin Film Transistor. With reference to FIG. 5, the method comprises the steps of:

in step S501, forming a pattern of a gate insulating layer on a base substrate;

in step S502, forming a conductive layer on the gate insulating layer;

in step S503, forming a pattern of a gate on the conductive layer; and in step S504, processing the conductive layer by a patterning process and forming a pattern of the conductive layer, so that the projection of the pattern of the conductive layer on the base substrate is greater than the projection of the gate on the base substrate.

In the method for manufacturing a Thin Film Transistor provided by an embodiment of the present disclosure, after the step of forming a pattern of a gate insulating layer on a base substrate, a conductive layer is formed on the gate insulating layer, a pattern of a gate is formed on the conductive layer, and the conductive layer is processed to form the pattern of the conductive layer, in such a way that the projection of the conductive layer on the base substrate is greater than the projection of the gate on the base substrate. In comparison with the prior art, the conductive layer is added between the gate insulating layer and the gate, and the projection of the conductive layer on the base substrate covers the projection of the gate on the base substrate, i.e., the width of the cross-section of the conductive layer is greater than the width of the cross-section of the gate, such that there is the conductive layer electrically connected with the gate in the offset area between the gate and the active layer. When there is voltage applied at the gate, the voltage in the offset area can be increased due to the conductive layer, thereby reducing the resistance experienced by carriers, and increasing on-state currents of the Thin Film Transistor and improving current characteristics of the Thin Film Transistor.

In a specific embodiment, in the method for manufacturing a Thin Film Transistor provided by the embodiment of the present disclosure, before the step of forming a pattern of a gate insulating layer, the method further comprises the step of: forming a pattern of an active layer on the base substrate.

In a specific embodiment, in the method for manufacturing a Thin Film Transistor provided by the embodiment of the present disclosure, the projection of the pattern of the conductive layer on the base substrate and the projection of the active layer on the base substrate at least partially overlap. For instance, the projection of the pattern of the conductive layer on the base substrate and the projection of the active layer on the base substrate overlap, so that the arranged conductive layer covers an offset area between the active layer and the gate. When there is voltage applied at the gate, the voltage of the gate is applied to the entire active layer including the offset area due to the conductive layer, thereby reducing the resistance experienced by carriers, and increasing on-state currents of the Thin Film Transistor and further improving current characteristics of the Thin Film Transistor.

Specifically, the pattern of the conductive layer can be simultaneously formed by conducting a patterning process once or can be formed by conducting a patterning process twice, which will not be limited herein.

It shall be explained that the pattern of the conductive layer can be formed by way of processing the conductive layer by the patterning process so as to form the pattern thereof, after the step of forming the pattern of the gate or before the step of forming the pattern of the gate, which will not be limited herein.

In order to render the formed pattern of the conductive layer in the offset area, an entire conductive layer is formed after forming the gate insulating layer. After the pattern of the gate is formed on the conductive layer, the conductive layer under the gate is processed.

In a specific embodiment, in the method for manufacturing a Thin Film Transistor provided by the embodiment of the present disclosure, the step of processing the conductive layer by a patterning process and forming a pattern of the conductive layer comprises the step of: plasma bombarding the conductive layer by a plasma process so that the projection of the pattern of the conductive layer on the base substrate is greater than the projection of the gate on the base substrate.

Specifically, before dry etching the gate insulating layer, the conductive layer outside of the area corresponding to the active layer is plasma bombarded by plasmas, so that the conductive layer outside of the area corresponding to the active layer is removed. The conductive layer may also be etched by a dry etching process or other patterning process, which will not be limited in the embodiments of the present disclosure.

In a specific embodiment, in the method for manufacturing a Thin Film Transistor provided by the embodiment of the present disclosure, when forming the active layer, there should be formed a source area electrically connected with a source to be formed and a drain area electrically connected with a drain to be formed, which are located on the same layer as the active layer and are oppositely arranged to each other.

It should be explained that in the method for manufacturing a Thin Film Transistor provided by an embodiment of the present disclosure, the gate may be formed after forming the source area and the drain area. Because the temperature required when forming the active layer of a polysilicon material is usually high, and the high temperature will affect the membranous layer under the active layer. Thus, in the above method for manufacturing, the pattern of the gate is formed after forming the pattern of the source area and the drain area.

Furthermore, in the method for manufacturing a Thin Film Transistor provided by an embodiment of the present disclosure, when the pattern of the gate is formed after the step of forming the patterns of a source area and a drain area, which are located on the same layer as the active layer and are oppositely arranged to each other, the pattern of the gate may be formed at the same time of forming the pattern of the source and that of the drain, or the pattern of the gate may be formed first and then the pattern of the source and that of the drain are formed thereafter, or of course, the pattern of the source and that of the drain are formed first and then the pattern of the gate is formed, which will not be limited herein.

In a specific embodiment, in the method for manufacturing a Thin Film Transistor provided by the embodiment of the present disclosure, the pattern of the source and that of the drain are formed after forming a pattern of the gate.

In a specific embodiment, when the Thin Film Transistor is used to control a pixel unit in the display panel, the drain of the Thin Film Transistor is usually required to be electrically connected with the pixel electrode in the pixel unit, and the pixel electrode is usually located above the Thin Film Transistor. Thus, in the method for manufacturing a Thin Film Transistor provided by the embodiment of the present disclosure, the pattern of the gate is formed before forming the pattern of the source and that of the drain. Since the source and the drain are located above the gate, it facilitates electrical connection between the drain and the pixel electrode.

In a specific embodiment, in the method for manufacturing a Thin Film Transistor provided by the embodiment of the present disclosure, the pattern of the source and that of the drain can be simultaneously formed by conducting a patterning process once or can be formed respectively by conducting a patterning process twice, which will not be limited herein.

Alternatively, in the method for manufacturing a Thin Film Transistor provided by the embodiment of the present disclosure, the pattern of the source and that of the drain may be formed simultaneously by conducting a patterning process once.

In a specific embodiment, in the method for manufacturing a Thin Film Transistor provided by the embodiment of the present disclosure, in order to insulate the gate from the source and the drain, after forming the pattern of the gate and before forming the pattern of the source and that of the drain, the method further comprises the step of forming an interlayer dielectric layer covering the gate, and forming a first through-hole and a second through-hole passing through the interlayer dielectric layer and the gate insulating layer, the first through-hole used for electrically connecting the source to be formed with the source area, and the second through-hole for electrically connecting the drain to be formed with the drain area.

Figure 6A:
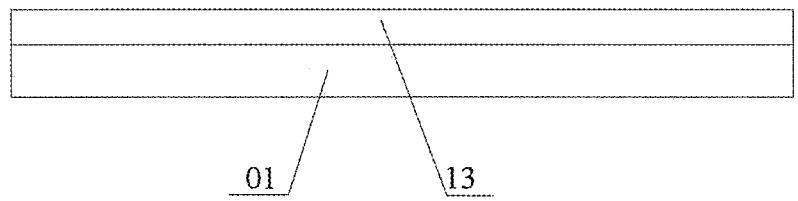
FIGS. 6a to 6j are structural schematic views corresponding to the method for manufacturing a Thin Film Transistor provided by an embodiment of the present disclosure.
Figure 6B:
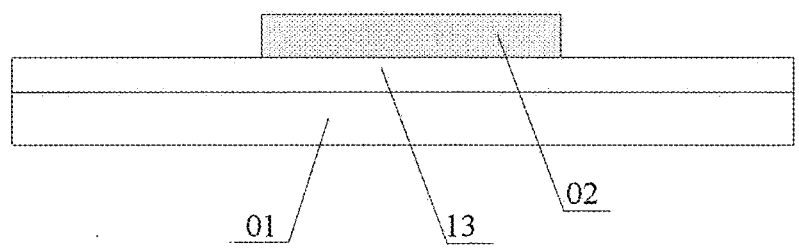
Figure 6C:
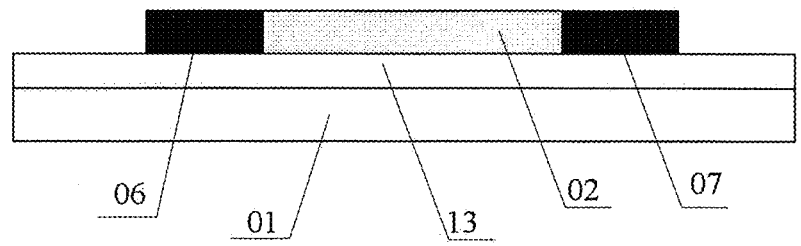
Figure 6D:
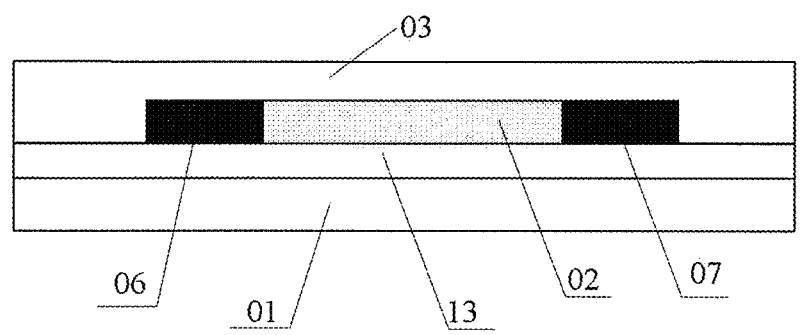
Figure 6E:
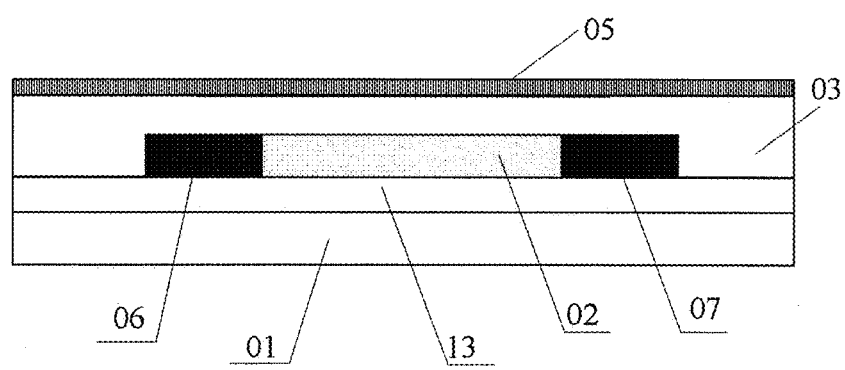
Figure 6F:
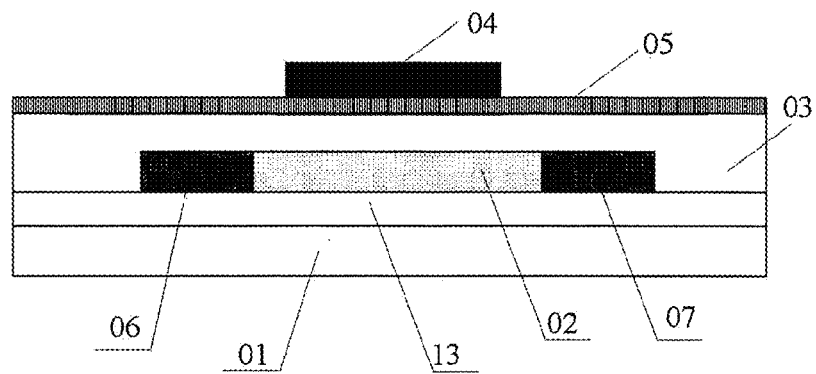
Figure 6G:
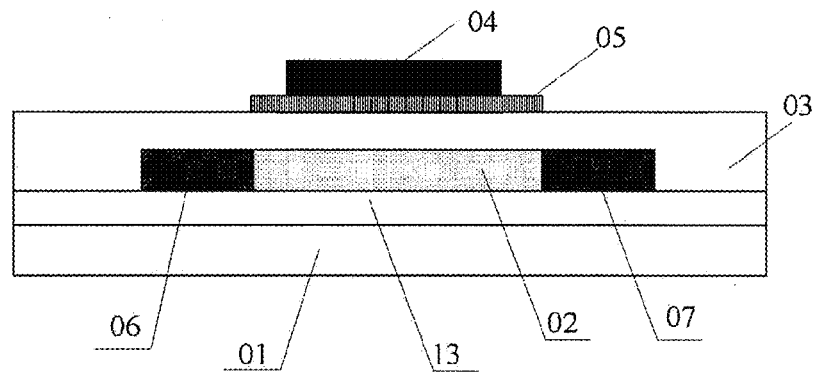
Figure 6H:
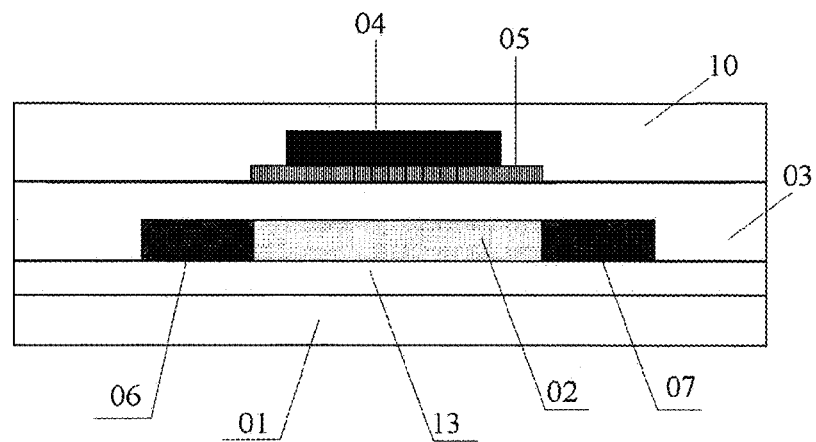
Figure 6I:
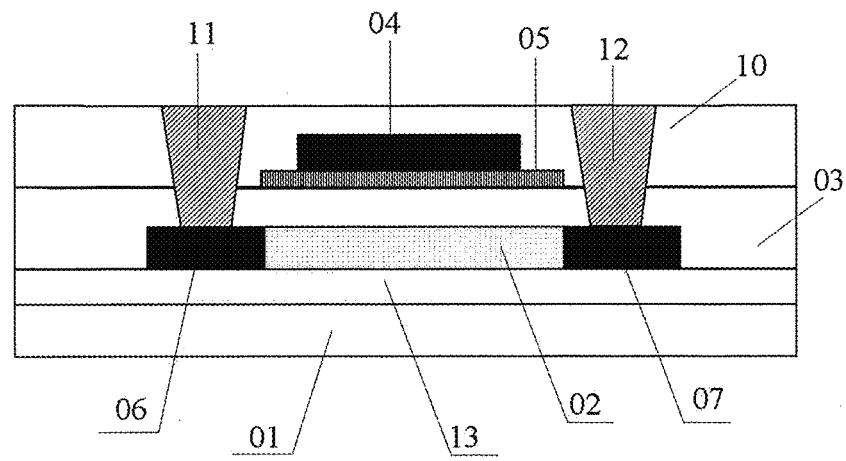
Figure 6J:
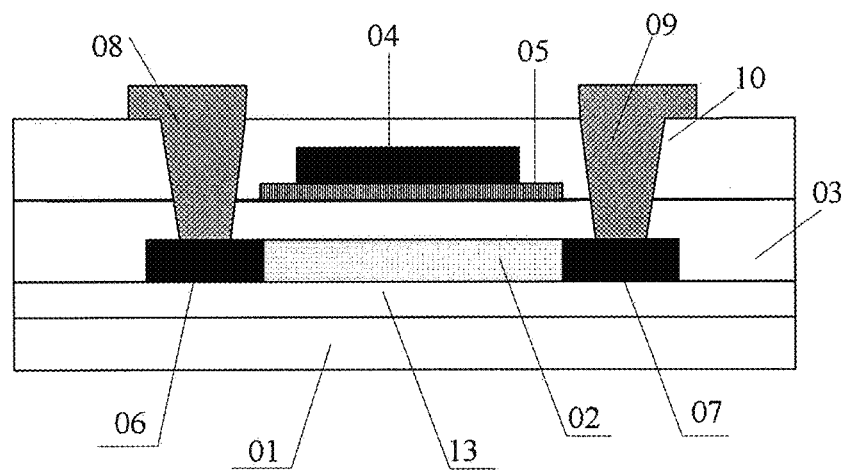

The method for manufacturing a Thin Film Transistor provided by the embodiment of the present disclosure will be explained using a specific embodiment. The method for manufacturing comprises the steps of:

in the first step, forming a buffer layer 13 on a base substrate 01, wherein the buffer layer 13 comprises one or more layers made of silicon oxide, silicon nitride or silicon oxynitride, as shown in FIG. 6a.

in the second step, forming a pattern of the active layer 02 on the buffer layer 13, as shown in FIG. 6b.

in the third step, forming the source area 06 electrically connected with a source to be formed and the drain area 07 electrically connected with a drain to be formed, which are located on the same layer as the active layer 02 and are oppositely arranged to each other, by conducting a patterning process once, as shown in FIG. 6c.

in the fourth step, forming the gate insulating layer 03 covering the active layer 02, as well as the source area 06 and the drain area 07, as shown in FIG. 6d.

in the fifth step, forming the conductive layer 05 covering the gate insulating layer 03, as shown in FIG. 6e.

in the sixth step, forming the pattern of the gate 04, as shown in FIG. 6f.

in the seventh step, plasma bombarding the conductive layer 05 in FIG. 6f to form the pattern as shown in FIG. 6g.

in the eighth step, forming the interlayer dielectric layer 10, as shown in FIG. 6h.

in the ninth step, forming the first through-hole 11 and the second through-hole 12 passing through the interlayer dielectric layer 10 and the gate insulating layer 03, as shown in FIG. 6i.

in the tenth step, forming the pattern of the source 08 and that of the drain 09, wherein the source 08 is electrically connected with the source area 06 through the first through-hole 11 and the drain 09 is electrically connected with the drain area 07 through the second through-hole 12, as shown in FIG. 6j.

The Thin Film Transistor is formed by the above steps, wherein the second, third, sixth, ninth and tenth steps require patterning by means of a patterning process. The patterning process may only include a photolithographic process, or include a photolithographic process and etching steps, or include other processes used for forming a predetermined pattern, such as printing or inkjet. The photolithographic process refers to the process which includes process procedures such as film formation, exposure and development and forms a pattern by means of photoresist, masks or exposure machines. In a specific implementation, a corresponding patterning process can be selected according to the structure formed in the present disclosure.

Figure 7:
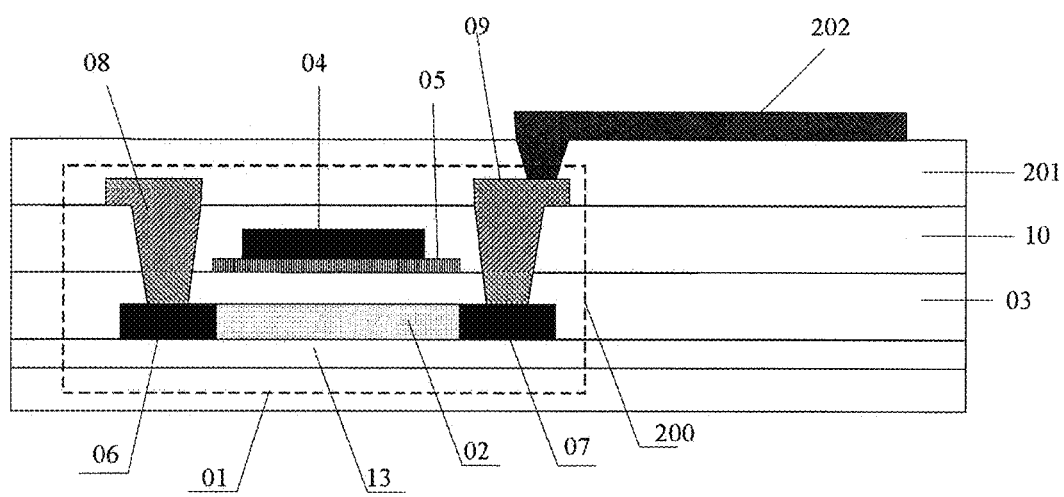
FIG. 7 is a structural schematic view of an array substrate provided by an embodiment of the present disclosure.

Based on the same inventive concept, an embodiment of the present disclosure also provides an array substrate, as shown in FIG. 7, which comprises any Thin Film Transistor 200 provided by the embodiments of the present disclosure. Since the problem-solving principle of the array substrate is similar to that of the Thin Film Transistor, the array substrate can be implemented with reference to the implementation of the Thin Film Transistor, which will not be reiterated.

Furthermore, the array substrate provided by an embodiment of the present disclosure, as shown in FIG. 7, further comprises a flat layer 201 and a pixel electrode 202 ordinally located above the Thin Film Transistor 200; wherein the pixel electrode 202 is electrically connected with the drain 09 in the Thin Film Transistor 200 through a through-hole.

Specifically, the array substrate provided by an embodiment of the present disclosure can be applied to an LCD panel, or an organic electroluminescent display panel, which will not be limited herein.

When the array substrate is applied to an LCD panel, the pixel electrode refers to the pixel electrode in the LCD panel; and when the array substrate is applied to an organic electroluminescent display panel, the pixel electrode refers to the cathode layer or the anode layer in the organic electroluminescent pixel structure.

Based on the same inventive concept, a display device provided by an embodiment of the present disclosure comprises any array substrate provided by the embodiments of the present disclosure. The display device may be any product or component having a display function, such as mobile phones, tablet computers, TVs, displays, laptops, digital photo frames and navigators. The display device can be implemented with reference to the embodiments of the array substrate, which will not be reiterated.

In the Thin Film Transistor and the method for manufacturing the same, the array substrate and the display panel provided by the embodiments of the present disclosure, the Thin Film Transistor comprises a base substrate, and a gate insulating layer formed above the base substrate, a gate formed above the gate insulating layer, and a conductive layer disposed between the gate insulating layer and the gate, wherein the projection of the conductive layer on the base substrate is larger than the projection of the gate on the base substrate. In comparison with the prior art, in the Thin Film Transistor provided by an embodiment of the present disclosure, the conductive layer is disposed between the gate insulating layer and the gate, and the projection of the conductive layer on the base substrate is greater than the projection of the gate on the base substrate. Thus, the projection of the conductive layer on the base substrate covers the projection of the gate on the base substrate, i.e., the width of the cross-section of the conductive layer is greater than the width of the cross-section of the gate, such that there is the conductive layer electrically connected with the gate in the offset area between the gate and the active layer of the Thin Film Transistor. When there is voltage applied at the gate, the voltage in the offset area can be increased due to the conductive layer, thereby reducing the resistance experienced by carriers, and increasing on-state currents of the Thin Film Transistor and improving current characteristics of the Thin Film Transistor.

Apparently, those skilled in the art can make various modifications and variations to the present disclosure without departing from the spirit and scope of the present disclosure. If the modifications and variations of the present disclosure fall within the scope of the claims of the present disclosure and equivalents thereof, the present disclosure is intended to include those modifications and variations.

What is claimed is:

1. A Thin Film Transistor comprising:
   a base substrate, a gate insulating layer and a gate disposed above the base substrate, and an active layer disposed between the base substrate and the gate insulating layer, wherein there is an offset area in a channel between the gate and the active layer;
   a conductive layer disposed between the gate insulating layer and the gate; and
   a source area electrically connected with a source to be formed and a drain area electrically connected with a drain to be formed, which are located on the same layer as the active layer and are oppositely arranged to each other,
   wherein a projection of the gate on the base substrate, a projection of the conductive layer on the base substrate and a projection of the active layer on the base substrate partially overlap with one another, the projection of the conductive layer on the base substrate is larger than the projection of the gate on the base substrate, and
   the projection of the active layer on the base substrate is larger than the projection of the conductive layer on the base substrate.

2. The Thin Film Transistor according to claim 1, wherein the conductive layer is made of one or more materials of a carbon material, metallic material and metallic oxide which are conductive.

3. The Thin Film Transistor according to claim 1, further comprising the source and the drain located above the gate.

4. The Thin Film Transistor according to claim 3, further comprising an interlayer dielectric layer located between the source and the gate, as well as between the drain and the gate;

wherein the source is electrically connected with the source area through a first through-hole passing through the interlayer dielectric layer and the gate insulating layer, and the drain is electrically connected with the drain area through a second through-hole passing through the interlayer dielectric layer and the gate insulating layer.

5. An array substrate, comprising the Thin Film Transistor according to claim 1.

6. The array substrate according to claim 5, further comprising a flat layer and a pixel electrode ordinally located above the Thin Film Transistor; wherein the pixel electrode is electrically connected with the drain in the Thin Film Transistor through a contact hole.

7. A display device comprising the array substrate according to claim 5.

8. A method for manufacturing a Thin Film Transistor according to claim 1, comprising the steps of:
    forming a pattern of an active layer, a source area electrically connected with a source to be formed and a drain area electrically connected with a drain to be formed simultaneously on the base substrate, wherein the source area and the drain area are oppositely arranged to each other;
    forming a pattern of a gate insulating layer covering the active layer on a base substrate;
    forming a conductive layer on the gate insulating layer;
    forming a pattern of a gate on the conductive layer, wherein an offset area is in a channel between the gate and the active layer; and
    processing the conductive layer by a patterning process and forming a pattern of the conductive layer, so that there is the conductive layer in the offset area, a projection of the gate on the base substrate, a projection of the conductive layer on the base substrate and a projection of the active layer on the base substrate partially overlap with one another, the projection of the conductive layer on the base substrate is larger than the projection of the gate on the base substrate, and the projection of the active layer on the base substrate is larger than the projection of the conductive layer on the base substrate.

9. The method according to claim 8, wherein the step of processing the conductive layer by a patterning process and forming a pattern of the conductive layer comprises the step of:
    plasma bombarding the conductive layer by a plasma process so that the projection of the pattern of the conductive layer on the base substrate is greater than the projection of the gate on the base substrate.

10. The method according to claim 8, further comprising the step of forming a pattern of the source and that of the drain after the step of forming a pattern of the gate.

11. The method according to claim 10, wherein after the step of forming a pattern of the gate and before the step of forming a pattern of the source and that of the drain, the method further comprises the steps of:
    forming an interlayer dielectric layer covering the gate; and
    forming a first through-hole and a second through-hole passing through the interlayer dielectric layer and the gate insulating layer, the first through-hole used for electrically connecting the source to be formed with the source area, and the second through-hole for electrically connecting the drain to be formed with the drain area.

12. The method according to claim 8, wherein the conductive layer is made of one or more materials of a carbon material, metallic material and metallic oxide which are conductive.

* * * * *